United States Patent [19]

Kuwahara

[11] Patent Number: 4,571,536
[45] Date of Patent: Feb. 18, 1986

[54] SEMICONDUCTOR VOLTAGE SUPPLY CIRCUIT HAVING CONSTANT OUTPUT VOLTAGE CHARACTERISTIC

[75] Inventor: Hisao Kuwahara, Kamakura, Japan

[73] Assignee: Tokyo Shibaura Denki Kabushiki Kaisha, Kawasaki, Japan

[21] Appl. No.: 525,706

[22] Filed: Aug. 23, 1983

[30] Foreign Application Priority Data

Aug. 23, 1982 [JP] Japan ................. 57-145737

[51] Int. Cl.$^3$ .............................................. H03F 1/30
[52] U.S. Cl. .................................. 323/311; 307/297; 323/313
[58] Field of Search ................ 307/296, 297; 310/311, 310/313, 314, 315, 316

[56] References Cited

U.S. PATENT DOCUMENTS

| | | | |
|---|---|---|---|
| 3,660,694 | 5/1972 | Lucas | 307/296 |
| 3,809,928 | 5/1974 | Evans | 307/297 |
| 3,939,434 | 2/1976 | Crosby | 307/297 |
| 4,057,789 | 11/1977 | Spadavecchia | 365/189 |
| 4,059,793 | 11/1977 | Ahmed | 323/313 |

FOREIGN PATENT DOCUMENTS 104752 8/1983 European Pat. Off. ............ 323/311

OTHER PUBLICATIONS

IBM Technical Disclosure Bulletin, vol. 25, No. 7A, Dec. 1982, p. 3548, New York, A. Z. Walach: "IC Current Source".
Analysis and Design of Analog Integrated Circuits, p. 236; Paul R. Gray, Robert G. Meyer; ©1977.

Primary Examiner—Peter S. Wong
Assistant Examiner—D. L. Rebsch
Attorney, Agent, or Firm—Finnegan, Henderson, Farabow, Garrett & Dunner

[57] ABSTRACT

A bias voltage supply circuit having a relatively stable constant voltage during load current fluctuations and driven by a relatively low DC power supply voltage, which includes a DC power supply terminal, a DC current source, a first transistor connected at its collector to the DC power supply terminal via the DC current source, a first resistor connected between the emitter of the first transistor and a reference potential terminal, a second transistor having its collector-emitter circuit connected in parallel with the series circuit of the DC current source and the first transistor, the base of the second transistor connected to the collector of the first transistor, a second resistor connected in parallel with the collector-base circuit of the first transistor and an output terminal connected to the base of the first transistor.

2 Claims, 5 Drawing Figures

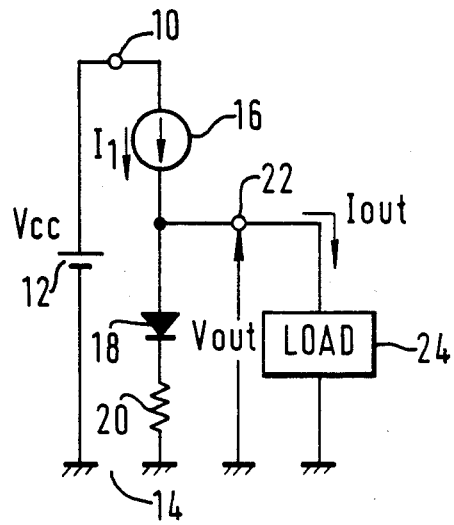
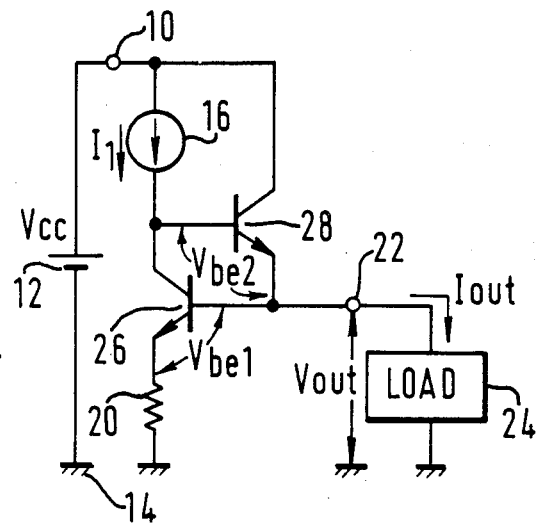
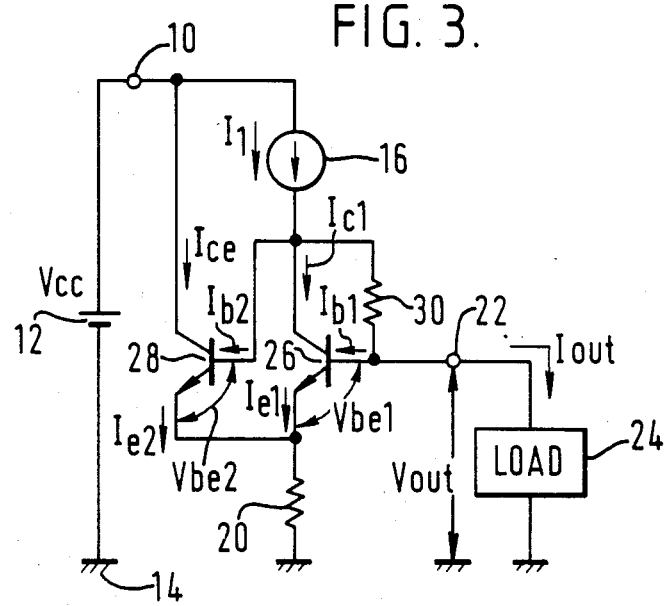

SEMICONDUCTOR VOLTAGE SUPPLY CIRCUIT HAVING CONSTANT OUTPUT VOLTAGE CHARACTERISTIC

BACKGROUND OF THE INVENTION

1. Field of the Invention

This invention relates to a bias voltage supply circuit, and more particularly, to a semiconductor bias voltage supply circuit for providing an electrical bias with a constant output voltage characteristic little affected by output current.

2. Description of the Prior Art

Constant bias voltage supply circuits are very useful in integrated circuit (IC) design. Many forms of constant bias voltage supply circuits have been developed. In constant bias voltage supply circuits, it is required that the operating bias voltage is not changed by a variation in the output current.

As is well known, a principal example of a bias voltage supply circuit in common use in the transistor circuit is shown in FIG. 1. In FIG. 1, DC power supply terminal 10 is connected to the positive terminal of battery 12, with its negative terminal connected to reference potential terminal 14. DC power supply terminal 10 is connected via DC current source 16, to diode 18 and resistance 20. Output terminal 22 is connected to a circuit connection between DC current source 16 and diode 18. Load 24 is connected between output terminal 22 and reference potential terminal 14. In this case, diode 18 can be a resistor or a constant-current circuit including a transistor and resistors.

If the output current of DC current source 16 is taken as $I_1$, the load current flowing to load 24 as $I_{out}$, and the forward voltage of diode 18 as $V_f$, output voltage $V_{out}$ is as follows.

$$V_{out} = V_f + (I_1 + I_{out})R_1 \quad (1)$$

where, $R_1$ is the resistance of resistor 20.

If, in this formula, the forward current of diode 18 is taken as $I_{d1}$, and its reverse saturation current as $I_{sd1}$, the following is obtained.

$$V_f = V_t \cdot \ln\left(\frac{I_{d1}}{I_{sd1}}\right) = V_t \cdot \ln\left(\frac{I_1 - I_{out}}{I_{sd1}}\right)$$

where,
$V_t$: thermal voltage = kT/q,
k: Boltzmann's constant,
T: absolute temperature,
q: electron charge.

Then, equation (1) is transformed as follows.

$$V_{out} = V_t \cdot \ln\left(\frac{I_1 - I_{out}}{I_{sd1}}\right) + (I_1 - I_{out}) \cdot R_1 \quad (2)$$

As an example, assume that when the ambient temperature is 27° C., $V_t = 26$ mV. The output voltage $V_{out(0)}$ when there is no load (i.e., when $I_{out}$ = zero amperes), is then calculated as follows from equation (2) above, microamps, assuming that $I_1 = 100$, $R_1 = 3000$ ohms and $I_{sd1} = 2.3 \times 10$ microamps:

$$V_{out(0)} = V_t \cdot \ln\left(\frac{I_1}{I_{sd1}}\right) + I_1 \cdot R_1$$

$$= 0.026 \cdot \ln\left(\frac{100 \times 10^{-6}}{2.03 \times 10^{-16}}\right) + 100 \times 10^{-6} \times 3 \times 10^3$$

$$= 0.700 + 0.300 = 1.000 \text{V (volt)}$$

Next, if output voltage $V_{out(50)}$ when there is a load current of 50 μA is calculated from formula (1), we have the following.

$$V_{out(50)} = 0.026 \cdot \ln\left(\frac{(100 - 50) \times 10^{-6}}{2.03 \times 10^{-16}}\right)$$

$$= (100 - 50) \times 10^{-6} \times 3 \times 10^3$$
$$= 0.682 + 0.150$$
$$= 0.832 \text{V}$$

In other words, whereas output voltage $V_{out(0)}$ when there is no load is 1.000 V, output voltage $V_{out(50)}$ when there is a load current of 50 μA, which is half of current $I_1$ of DC current source 14, is 0.832 V, representing a fall of 0.178 V. Thus the bias voltage supply circuit of FIG. 1 causes fluctuations in the load current which give rise to large fluctuations in the output voltage $V_{out}$.

Another example of a prior art bias voltage supply circuit is shown in FIG. 2, in which transistors 26 and 28 are used. In this case, considering that the relationship of base current $I_{b1}$ of transistor 26 and load current $I_{out}$ is $I_{b1} I_{out}$, and taking the base-emitter voltage, emitter current, and reverse saturation current of transistor 26 as $V_{be1}$, $I_{e1}$, and $I_{s1}$ respectively, output voltage $V_{out}$ is as follows.

$$V_{out} = V_{be1} + I_{e1} \cdot R_1 \quad (3)$$

$$= V_t \cdot \ln\left(\frac{I_{e1}}{I_{SQ1}}\right) + I_{e1} \cdot R_1$$

If the grounded emitter circuit current amplification factors of transistors 26 and 28 are taken as $\beta_1$ and $\beta_2$ respectively, we have the following.

$$I_{e1} = I_{c1} + I_{b1} = I_{c1} \cdot (1 + 1/\beta_1)$$

wherein $I_{c1} = I_1 - I_{b2}$, then $$I_{e1} = (I_1 - I_{b2}) \cdot (1 + 1/\beta_1) = I_1 \cdot (1 + 1/\beta_1) - I_{b2} \cdot (1 + 1/\beta_1)$$

therefore, $$I_{e1} = I_1 \cdot \left(1 + \frac{1}{\beta_1}\right) \cdot - \frac{1}{1 + \beta_2}\left(1 + \frac{1}{\beta_1}\right)$$

If $\beta_2$ is assumed to be very large, then we have $$I_{e1} = I_1 \cdot (1 + 1/\beta_1) \quad (4)$$

with emitter current $I_{e1}$ ceasing to be influenced by load current $I_{out}$. This being so, the output voltage $V_{out}$ expressed by formula (4) given above also ceases to be affected by load current $I_{out}$.

In the bias voltage supply circuit of FIG. 2, for the formula (4) to be applicable, grounded emitter circuit current amplification factor $\beta_2$ of transistor 28 must be very large. In other words, the magnitude of the changes in output voltage $V_{out}$ of the bias voltage supply circuit of FIG. 2 in response to fluctuations in load current $I_{out}$ depends to a large extent on the current-amplification action of transistor 28. However, for transistor 28 to provide this current-amplification action, the base-emitter junction of transistor 28 must be biased in the forward direction. This means that voltage $V_{cc}$ at DC power supply terminal 10 must be $$V_{cc} = V_{out} + V_{be2}$$

(where $V_{be2}$ is the base-emitter voltage of transistor 28). This requires a high consumption of electric power. It may be noted here that voltage $V_{cc}$ of DC power supply terminal 10 in the bias voltage supply circuit of FIG. 1 need by only $V_{cc} = V_{out}$.

SUMMARY OF THE INVENTION

An object of the invention is to provide a bias voltage supply circuit of very high quality which can operate at a low voltage, and in which the regulation of the output voltage with fluctuations in the load current is small.

In accordance with this invention, a bias voltage supply circuit comprises a DC power supply terminal, a DC current source, a first transistor connected at its collector to the DC power supply terminal via the DC current source, a first resistor connected between the emitter of the first transistor and a reference potential terminal, a second transistor having its collector-emitter circuit connected in parallel with the series circuit of the DC current source and the first transistor, the base of the second transistor connected to the collector of the first transistor, a second resistor connected in parallel with the collector-base circuit of the first transistor and an output terminal connected to the base of the first transistor.

BRIEF DESCRIPTION OF THE DRAWINGS

FIGS. 1 and 2 are circuit diagrams of conventional bias voltage supply circuits;

FIG. 3 is a circuit diagram of an embodiment of the bias voltage supply circuit of this invention.

DETAILED DESCRIPTION OF THE PREFERRED EMBODIMENTS

Figure 4:
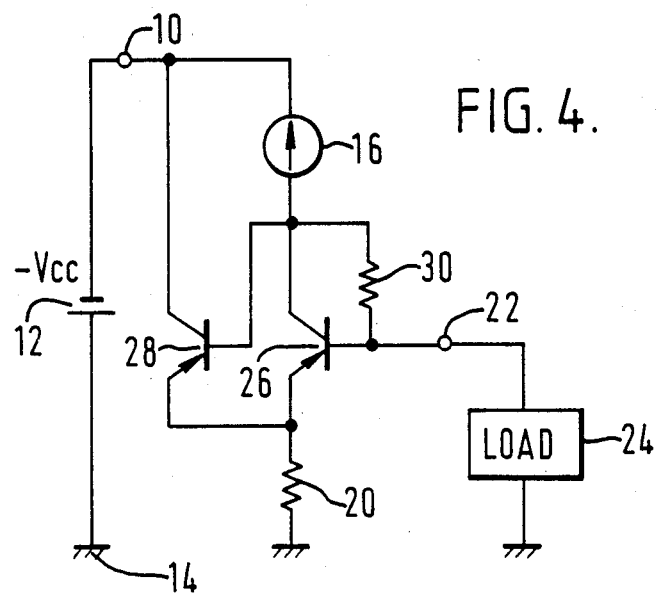
FIGS. 4 and 5 are circuit diagrams of modified forms of the same embodiment of FIG. 3.

The present invention will be described in detail with reference to the accompanying drawings FIGS. 3–5. Throughout the drawings including FIGS. 1 and 2, like reference numerals and letters are used to designate like or equivalent elements for the sake of simplicity of explanation.

Referring now to FIG. 3, there is shown in circuit diagram a bias voltage supply circuit according to the present invention. The circuit comprises DC power supply terminal 10 connected to a positive terminal of battery 12 with its negative terminal connected to reference potential terminal 14. DC power supply terminal 10 is connected to reference potential terminal 14 via DC current source 16, first NPN transistor 26 and resistor 20. Second NPN transistor 28 is connected in parallel with the series circuit of DC current source 16 and first NPN transistor 26. The emitters of the transistors 26 and 28 are connected together, and the base of second NPN transistor 28 is connected to the collector of first NPN transistor 26. The collector-base circuit of first transistor 26 is connected in parallel with resistor 30, and the base of first transistor 26 is connected to output terminal 22 of the bias voltage supply circuit. Load 24 is connected to output terminal 22.

The output voltage $V_{out}$ in this configuration will now be discussed. To simplify the analysis, it is assumed that grounded emitter circuit current amplification factors $\beta_1$, $\beta_2$ of transistors 26 and 28 are very large, and that base currents $I_{b1}$ and $I_{b2}$ can be ignored in relation to collector currents $I_{c1}$ and $I_{c2}$ (emitter currents $I_{e1}, I_{e2}$). The following is assumed.

$$I_{e1} = I_{c1}, \; I_{e2} = I_{c2}$$

It is also assumed that base currents $I_{b1}$ and $I_{b2}$ of transistors 26 and 28 are so small in relation to load current $I_{out}$ that they can be ignored. It is also assumed that the characteristics of transistors 26 and 28 are exactly matched. If the base-emitter voltage of transistor 26 is taken as $V_{be1}$, output voltage $V_{out}$ an output terminal 22 is as follows.

$$V_{out} = V_{be1} + (I_{e1} + I_{e2}) \cdot R_1 \tag{5}$$

wherein $R_1$ is the resistance of resistor 20.

If $I_{e2}/I_{e1} = K$, and the current of DC current source 16 and the output current of the bias voltage supply circuit are taken as $I_1$ and $I_{out}$, we have the following.

$$I_{e1} = I_1 - I_{out}, \; I_{c2} = K \cdot (I_1 - I_{out})$$

If the base-emitter voltage of transistor 28 is taken as $V_{be2}$, the voltage difference $V_{be}$ between base-emitter voltages $V_{be2}$ and $V_{be1}$ is $$V_{be} = V_{be2} - V_{be1} = V_t \ln K = I_{out} R_2$$

and $$K = e^{\frac{I_{out} \cdot R_2}{V_t}},$$

where e is raised to the given exponential power.

If the reverse saturation current of transistor 26 is taken as $I_{SQ1}$, the above equation (5) is transformed as follows.

$$\begin{aligned}
V_{out} &= V_{be1} + (I_{e1} + I_{e2}) \cdot R_1 \tag{6}\\
&= V_t \cdot \ln\left(\frac{I_{e1}}{I_{SQ1}}\right) + (I_1 - I_{out}) + K \cdot (I_1 - I_{out}) \cdot R_1 \\
&= V_t \cdot \ln\left(\frac{I_1 - I_{out}}{I_{SQ1}}\right) + (1 - K) \cdot (I_1 - I_{out}) \cdot R_1 \\
&= V_t \cdot \ln\left(\frac{I_1 - I_{out}}{I_{SQ1}}\right) + \\
&\quad \left(1 + e^{\frac{I_{out} \cdot R_2}{V_t}}\right) \cdot (I_1 - I_{out}) \cdot R_1
\end{aligned}$$

Using formula (4), when $I_{out} < I_1$, it is possible to select an appropriate value for resistance $R_2$, so that loaded output voltage $V_{out(L)}$ when load 24 is connected is equal to non-loaded output voltages $V_{out(0)}$ (i.e., when $I_{out}=0$). That is to say, by the substitution of $I_{out}=0$ in formula (6), $V_{out(0)}$ is as follows.

$$V_{out(0)} = V_t \cdot \ln\left(\frac{I_1}{I_{SQ1}}\right) + 2I_1 \cdot R_1$$

To find the resistance $R_2$ of resistor 30, set $V_{out(0)} = V_{out(L)}$, then $$V_t \cdot \ln\left(\frac{I_1}{I_{SQ1}}\right) + 2I_1 \cdot R_1 = V_t \cdot \ln\left(\frac{I_1 \, I_{out}}{I_{SQ1}}\right) + \left(1 + e^{\left(\frac{I_{out} \cdot R_2}{V_t}\right)}\right) \cdot (I_1 - I_{out}) \cdot R_1$$

and we therefore have the following:

$$R_2 = \frac{V_t}{I_{out}} \cdot \ln\left\{\frac{V_t \cdot \ln\frac{I_1}{I_1 - I_{out}}}{(I_1 - I_{out}) \cdot R_1} + \left(\frac{I_1 + I_{out}}{I_1 - I_{out}}\right)\right\} \quad (7)$$

If, assuming that $I_1 = 100$ μA, $I_{out} = 50$ μA, and $R_1 = 1.5$ KΩ, the value of R2 at which $V_{out(0)} = V_{out(L)}$ is calculated from formula (6), we have the following.

$$R_2 = \frac{0.026}{50 \times 10^{-6}} \cdot$$

$$\ln\left\{\frac{0.026 \cdot \ln\left(\frac{100}{100-50}\right)}{(100-50) \times 10^{-6} \times 1.5 \times 10^3} + \frac{100+50}{100-50}\right\}$$

$$= 611$$

The Table below shows the values (calculated by formulas (1) and (6) of output voltage $V_{out}$ with load current $I_{out}$ varied in steps of 10 A within the range $-90$ μA~90 μA, when $I_1 = 100$ μA, $I_{sd1} = 2.03 \times 10$ μA $R_1 = 3$ kΩ in the conventional circuit of FIG. 1, and $I_1 = 100$ μA, $I_{sq1} = 2.03 \times 10$ μA $R_1 = 1.5$ kΩ, $R_2 = 611$Ω in the embodiment shown in FIG. 3.

TABLE

| Load Current (I out) (μA) | Output voltage ($V_{out}$) (V) | |
|---|---|---|
| | FIG. 1 | FIG. 3 |
| −90 | 1.287 | 1.036 |
| −80 | 1.255 | 1.026 |
| −70 | 1.225 | 1.018 |
| −60 | 1.192 | 1.011 |
| −50 | 1.161 | 1.005 |

TABLE-continued

| Load Current (I out) (μA) | Output voltage ($V_{out}$) (V) | |
|---|---|---|
| | FIG. 1 | FIG. 3 |
| −40 | 1.129 | 1.001 |
| −30 | 1.097 | 0.998 |
| −20 | 1.065 | 0.998 |
| −10 | 1.032 | 0.997 |
| 0 | 1.000 | 1.000 |
| 10 | 0.967 | 1.003 |
| 20 | 0.934 | 1.006 |
| 30 | 0.901 | 1.009 |
| 40 | 0.861 | 1.007 |
| 50 | 0.831 | 1.000 |
| 60 | 0.796 | 0.982 |
| 70 | 0.759 | 0.947 |
| 80 | 0.718 | 0.885 |
| 90 | 0.670 | 0.779 |

As will be clear from this Table, in the conventional bias circuit of FIG. 1 load current $I_{out}$ fluctuates within the range $-50$ μA 50 μA cause output voltage $V_{out}$ deviations within the range $+0.161$ V~$-0.169$ V. In the embodiment of the invention shown in FIG. 3, however, output voltage $V_{out}$ deviations are only within the narrow range of $+0.009$ V~$-0.003$ V. In comparison with the conventional type of circuit, therefore, fluctuations, in output voltage $V_{out}$ in relation to changes in load current $I_{out}$ are minimal.

Next, the range of voltage $V_{cc}$ at DC supply terminal 10 in FIG. 3 can be compared with voltage $V_{cc}$ at DC supply terminal 10 in FIG. 2. Voltage $V_{cc}$ of DC supply terminal 10 shown in FIG. 3 is as follows:

$$V_{cc} \leqq V_{out} + I_{out} \cdot R_2 \quad \text{(FIG. 3)}$$

while voltage $V_{cc}$ of DC supply terminal 10 of the conventional bias circuit shown in FIG. 2 is as follows:

$$V_{cc} \leqq V_{out} + V_{be2} = V_t \cdot \ln\left(\frac{I_{out}}{I_{SQ2}}\right) \quad \text{(FIG. 2)}$$

where $I_{sq2}$ is the reverse saturation current of transistor 28.

If $V_{out} = 1$ V, $I_{out} = 50$ μA, $R_2 = 611$Ω, and $I_{sq1} = 2.03 \times 10^{-10}$ μA, the minimum value of voltage $V_{cc}$ of DC power supply terminal 10 in the embodiment shown in FIG. 3 is approximately 1.031 V, while the minimum value of voltage $V_{cc}$ of DC power supply terminal 10 in the conventional bias circuit of FIG. 2 is approximately 1.682 V. Note that the voltage drops of DC current sources 16 in circuits FIGS. 2 and 3 are ignored. Compared with the conventional circuits, a lower minimum value of voltage $V_{cc}$ from DC power supply terminal 10 is needed in the embodiment shown in FIG. 3.

In a configuration such as that of the embodiment described above, in accordance with the invention, the fluctuations of output voltage $V_{out}$ in relation in the fluctuations of load current $I_{out}$ are extremely small, and power consumption is also reduced.

FIG. 4 shows a modified form of the embodiment described above, with transistors 26 and 28 of the PNP type. In this case, the same effect is obtained by having DC supply terminal 10 and DC current source 16 of the opposite polarities to those in FIG. 3. Further, in the explanation given above, transistors 26 and 28 were assumed to have matched characteristics. They can, however, have different characteristics as may be required, for example, by changing the emitter area of transistor 2B in relation to that of transistor 26. Also, the output voltage $V_{out}$ can be controlled by interposing resistances at appropriate points in the circuit of FIG. 3.

Figure 5:
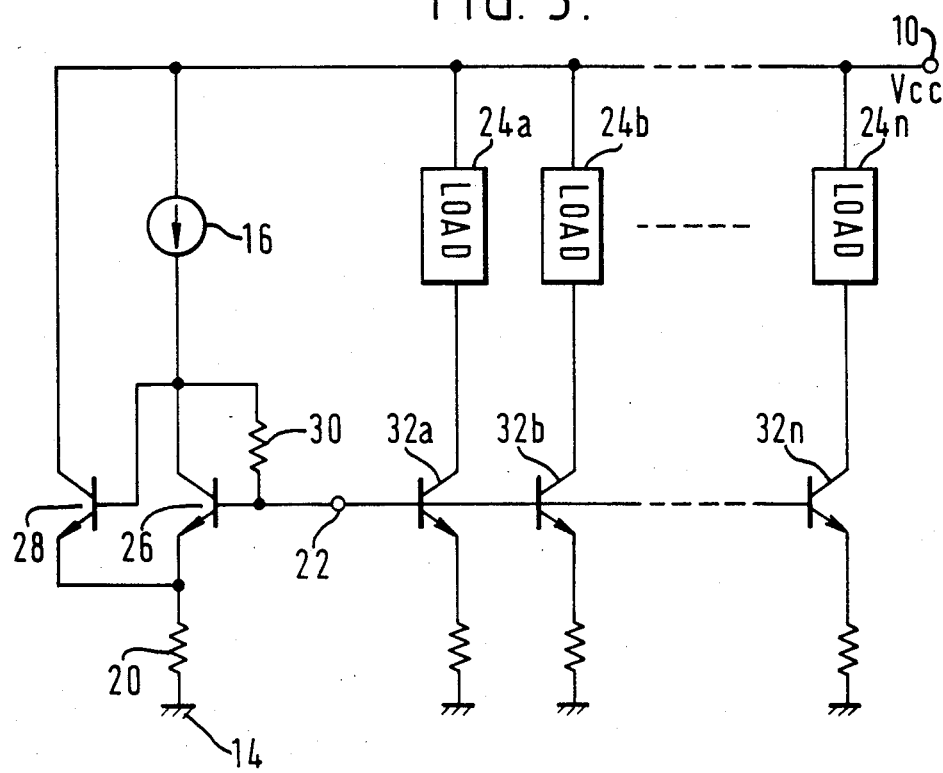

FIG. 5 shows the embodiments described above applied to a circuit where the sum of the base currents of transistors $32a \ldots 32n$ constitute load current $I_{out}$. In this case, as explained earlier, since the fluctuations in load current $I_{out}$, i.e., the base current of transistor 26, are very small, an outstandingly good circuit can be achieved, with minimal dependence on grounded emitter circuit current amplification factors of transistors 26, 28, $32a \ldots 32n$.

The invention is not restricted to the embodiments described above. Various other modifications are possible without departing from its essential substance.

What is claimed is:

1. A constant output voltage supply circuit comprising:
   a DC power source operable to supply DC power between a supply terminal and a reference potential terminal;
   a DC current source;
   a first transistor having a collector, an emitter and a base and connected at its collector to said supply terminal via said DC current source;
   a first resistor connected between the emitter of said first transistor and the reference potential terminal;
   a second transistor having a collector, an emitter and a base, the collector of said second transistor being connected to the supply terminal, the emitter of said second transistor being connected to the emitter of said first transistor, and the base of said second transistor being connected to the collector of said first transistor;
   a second resistor connected between the collector and base of said first transistor; and
   an output terminal connected to the base of said first transistor whereby the current flowing through the first transistor compensates for variances in the current flowing through the second transistor to maintain the current flow through the first resistor constant to provide a constant output voltage characteristic.

2. A constant output voltage supply circuit according to claim 1, wherein the resistance of R2 of said second resistor is given by the equation:

$$R2 = \frac{Vt}{Iout} \cdot \ln\left( \frac{Vt \cdot \ln \frac{I_1}{I_1 - Iout}}{(I_1 - Iout) \cdot R1} + \left(\frac{I_1 + Iout}{I_1 - Iout}\right) \right)$$

where
Vt: thermal voltage = kT/q,
k: Boltzman's constant,
T: absolute temperature,
q: electron charge,
$I_{out}$: output current at said output terminal,
I1: current supplied from said DC current source,
R1: resistance of said first resistor.

* * * * *